United States Patent
Bromberger

(10) Patent No.: US 7,397,109 B2
(45) Date of Patent: Jul. 8, 2008

(54) METHOD FOR INTEGRATION OF THREE BIPOLAR TRANSISTORS IN A SEMICONDUCTOR BODY, MULTILAYER COMPONENT, AND SEMICONDUCTOR ARRANGEMENT

(75) Inventor: Christoph Bromberger, Heilbronn (DE)

(73) Assignee: ATMEL Germany GmbH, Heilbronn (DE)

( * ) Notice: Subject to any disclaimer, the term of this patent is extended or adjusted under 35 U.S.C. 154(b) by 0 days.

(21) Appl. No.: 11/192,187

(22) Filed: Jul. 29, 2005

(65) Prior Publication Data

US 2006/0022306 A1 Feb. 2, 2006

(30) Foreign Application Priority Data

Jul. 31, 2004 (DE) .................. 10 2004 037 252

(51) Int. Cl.
*H01L 27/082* (2006.01)
*H01L 27/102* (2006.01)
*H01L 29/70* (2006.01)
*H01L 31/11* (2006.01)

(52) U.S. Cl. ..................... 257/565; 257/197
(58) Field of Classification Search ................ 257/197, 257/565–593
See application file for complete search history.

(56) References Cited

U.S. PATENT DOCUMENTS

| | | | |
|---|---|---|---|
| 4,771,013 A | | 9/1988 | Curran |
| 4,821,090 A | * | 4/1989 | Yokoyama .................. 257/195 |
| 5,376,821 A | | 12/1994 | Puzzolo et al. |
| 5,561,306 A | * | 10/1996 | Imamura et al. ............ 257/197 |
| 5,923,055 A | | 7/1999 | Schlangenotto |
| 6,492,711 B1 | * | 12/2002 | Takagi et al. ................ 257/593 |
| 6,674,104 B2 | * | 1/2004 | Phillips ..................... 257/197 |
| 6,703,647 B1 | * | 3/2004 | Garcia et al. ................ 257/184 |
| 2001/0050412 A1 | | 12/2001 | Patti | |

FOREIGN PATENT DOCUMENTS

| | | |
|---|---|---|
| DE | 37 43 774 A1 | 7/1989 |
| EP | 0 493 854 A1 | 7/1992 |
| EP | 0 605 920 A1 | 7/1994 |
| WO | WO-2005/020330 A1 | 3/2005 |

OTHER PUBLICATIONS

Barrie Gilbert, "A Precise Four-Quadrant Multiplier With Subnanosecond Response," IEEE Journal of Solid-State Circuits, vol. SC-3, No. 4, Dec. 1968, pp. 365-373; ISSN: 0018-9200.

* cited by examiner

Primary Examiner—Monica Lewis
(74) Attorney, Agent, or Firm—Muncy, Geissler, Olds & Lowe, PL

(57) ABSTRACT

A method for integrating three bipolar transistors into a semiconductor body, multilayer component, and semiconductor arrangement is provided. A tendency toward thyristor-like behavior of the multilayer semiconductor arrangements with the three bipolar transistors is suppressed with the aid of a heterojunction. The high frequency characteristics and the blocking capability of the circuit of the three bipolar transistors is made more flexible, while the capability of an input signal to control an output signal is maintained.

6 Claims, 2 Drawing Sheets

METHOD FOR INTEGRATION OF THREE BIPOLAR TRANSISTORS IN A SEMICONDUCTOR BODY, MULTILAYER COMPONENT, AND SEMICONDUCTOR ARRANGEMENT

This nonprovisional application claims priority under 35 U.S.C. § 119(a) on German Patent Application No. DE 102004037252.7, which was filed in Germany on Jul. 31, 2004, and which is herein incorporated by reference.

BACKGROUND OF THE INVENTION

1. Field of the Invention

The present invention relates to a method for integrating three bipolar transistors into a semiconductor body, a multilayer component, and a semiconductor arrangement.

2. Description of the Background Art

From the document EP 0 493 854, which corresponds to U.S. Pat. No. 5,376,821, and which is hereinafter referred to as D1, are known vertical integrated cascode structures having only two transistors for high voltage applications. In this arrangement, a transistor that has a high blocking capability and is geometrically on the bottom is vertically integrated with a transistor that is geometrically on top. Such arrangements are preferably used in the voltage range above 100 V. The emitter region of the transistor that is geometrically on the bottom has a significantly higher dopant concentration, with the same conductivity type, than an adjacent collector drift zone of the transistor that is geometrically on top. In this way, the emitter efficiency of the transistor that is geometrically on the bottom, in particular, is increased. The vertical integration of two npn transistors, for example, results in a parasitic pnp transistor, so that the arrangement from D1 tends toward thyristor-like behavior and the collector current only remains controllable within limits.

In the document EP 605920, hereinafter referred to as D2, the tendency of the arrangement toward thyristor-like behavior is reduced by increasing the Gummel number $G_B$ of the parasitic transistor. To this end, the emitter region of the bottom transistor is implemented as a highly doped layer that thoroughly isolates the base of the bottom transistor from the collector drift zone of the top transistor by creating a mesa structure. In D2, only two transistors can be integrated in the mesa structure. In another embodiment in D2, p-doped SiGe is used as an etch stop for producing the mesa structure in the base of the bottom transistor.

SUMMARY OF THE INVENTION

It is therefore an object of the present invention to provide a method for the integration of multiple bipolar transistors whose electrical properties are improved. Another object of the invention is to provide arrangements of bipolar transistors in semiconductor bodies and multilayer components.

In an embodiment of the present invention, a circuit component is integrated from at least two transistors such that at least two emitters and at least one collector of the transistors, or at least two collectors and at least one emitter of the transistors, form a common semiconductor region, with thyristor-like behavior of one or more parasitic transistors being reduced. Accordingly, a method is provided according to the invention for integration of three bipolar transistors into one semiconductor body, in which method a first semiconductor region with a first conductivity type is created. In addition, a second semiconductor region with a second conductivity type is created adjacent to the first semiconductor region. A third semiconductor region with the first conductivity type is created adjacent to the second semiconductor region. A fourth semiconductor region and a fifth semiconductor region with the second conductivity type are created adjacent to the third semiconductor region.

In addition, a sixth semiconductor region and a seventh semiconductor region with the first conductivity type are created, with the sixth semiconductor region being adjacent to the fourth semiconductor region and the seventh semiconductor region being adjacent to the fifth semiconductor region. The second semiconductor region and/or the fourth semiconductor region and/or the fifth semiconductor region can be produced from a first semiconductor material, while the third semiconductor region can be produced from a second semiconductor material. In this context, the first semiconductor material and the second semiconductor material are produced such that the value of the energy gap in the first semiconductor material is smaller than the value of the energy gap in the second semiconductor material by at least the mean thermal energy of the charge carriers.

As a result of the integration, a novel, preferably vertically integrated, branched cascode structure can be created. For example, the first conductivity type is n-type conductivity and the second conductivity type is p-type conductivity. In this example embodiment, a first npn transistor is formed by the first, second and third semiconductor regions, with an emitter of the first npn transistor being formed by the third semiconductor region, and a base being formed by the second semiconductor region. A second npn transistor is formed by the third semiconductor region and the fourth and sixth semiconductor regions. A third npn transistor is formed by the third semiconductor region and by the fifth and seventh semiconductor regions. Parasitic pnp transistors are also produced in addition to the desirable npn transistors. For example, a parasitic pnp transistor is formed by the p-doped second semiconductor region, the n-doped third semiconductor region and the p-doped fifth semiconductor region.

In this example embodiment, the size of the energy gap in the first semiconductor material is smaller than the size of the energy gap in the second semiconductor material by more than ten times the mean thermal energy of the charge carriers. As the difference in the sizes of the energy gaps increases, the characteristic of the inventive structure to suppress the thyristor-like behavior of the parasitic pnp transistors increases.

In this context, electrons which carry the emitter current of the first npn transistor cross the first heterojunction, which is formed by the two different semiconductor materials of the second, p-doped semiconductor region and the third n-doped semiconductor region, in a first direction. Holes, which cross the first heterojunction in the opposite direction, carry the emitter current of the parasitic pnp transistor. In an active forward operation, one conduction band edge is at comparable energy values in the base and the emitter of the first npn transistor. Accordingly, a difference in the value of the energy gap on the two sides of the heterojunction results in a step in the valence band, which reduces the movement of holes across the first heterojunction and thus the emitter current of the parasitic pnp transistor.

In an embodiment of the invention, both the fourth semiconductor region and the fifth semiconductor region can be produced from the first semiconductor material. This serves to reduce thyristor-like behavior of parasitic transistors especially when the emitters of the second and third transistors form the shared third semiconductor region together with the collector of the first transistor. In this case the parasitic transistors are formed by the fourth, third, and second semiconductor regions and by the fifth, third and second semiconductor regions, respectively, where the emitter-base junctions of the parasitic transistors arise between the fourth and third semiconductor regions and between the fifth and third semiconductor regions, respectively. Consequently, as a function of the wiring of the three transistors, it is necessary to investigate the parasitic transistors; insofar as they tend toward thyristor-like behavior as a result of the external wiring, it is necessary to reduce the effect of this behavior, or completely suppress it for the specific application, by a heterojunction.

In this context, the change in the band gap in the second or fourth or sixth semiconductor region can be designed to be continuous, abrupt, or stepped. As a result of a suitable shape of the band gap, a quasi-electric field is generated in a non-depleted semiconductor region; this field accelerates the minority charge carriers and thereby advantageously raises the gain-bandwidth product $f_T$ of the high-frequency semiconductor arrangement preferably created by applying this further development of the invention.

Another embodiment of the method provides for the creation in the second semiconductor region of a band gap that is larger at the boundary with the third semiconductor region than at the boundary with the first semiconductor region. In another embodiment of the method, a band gap is created in the fourth or fifth semiconductor region that is larger at the boundary with the third semiconductor region than at the boundary with the sixth, or, respectively, the seventh semiconductor region.

As a function of the required blocking voltage and the wiring of the three transistors, the dopant concentration in the third semiconductor region can be matched to the specific function of the three transistors. In a further embodiment, the third semiconductor region can be homogeneously doped for its creation. Homogeneous doping of the fifth semiconductor region should be understood to mean that the dopant concentrations at any two points in this semiconductor region differ from one another by less than two powers of ten, preferably by less than one power of ten.

In a further embodiment of the invention, at least two of the three transistors, preferably three transistors, are vertically integrated. In this context, vertical integration is understood to mean that the pn junctions extend parallel to a primary surface of the semiconductor body. It is preferred in this regard for at least two transistors to be arranged vertically one above the other in the thickness of the semiconductor body, so that these two transistors occupy the same chip area at least in part. Contact is made to the base, emitter and collector regions of the transistors as appropriate for the wiring.

$Si_{1-x}Ge_x$ can be used as the first semiconductor material and Si as the second semiconductor material. Along with the three bipolar transistors, standard components of silicon technology, such as CMOS, DMOS or other field-effect transistors with, and without, gate oxide, or small capacitors, can also be integrated into the semiconductor body.

The semiconductor body can have a third semiconductor material in addition to the first semiconductor material and the second semiconductor material. In this context, it is preferable for the second semiconductor region to be produced from the first semiconductor material and the fourth and/or fifth semiconductor region to be produced from the third semiconductor material.

It can be advantageous to arrange multiple transistors integrated laterally, with the least possible separation from one another. To this end, provision is made for the junctions between the semiconductor regions to extend essentially parallel to a primary surface of the semiconductor body. Preferably, oppositely doped semiconductor layers are epitaxially deposited for this purpose.

Another embodiment of the invention provides for one semiconductor region, which serves as a collector or an emitter of at least one transistor depending on the wiring of the transistors, to border on the substrate and to be electrically contacted with a connecting electrode from the front side of the wafer. Thus, in this case no rear side contact with the semiconductor body is necessary.

The fourth semiconductor region and the fifth semiconductor region can be produced laterally spaced apart from one another. This separation is created in particular by an etching of a separating structure, in particular a trench, or by locally selective epitaxial growth of the fourth and fifth semiconductor regions. The separation advantageously serves as insulation at the same time, in that the fourth and fifth semiconductor regions remain separated by a gas or vacuum. In contrast, in an alternative further development of the invention the fourth and fifth semiconductor regions are insulated from one another by an insulator. $SiO_2$ can serve as, for example, the insulator.

Another aspect of the invention is a multilayer component having semiconductor layers of a second conductivity type and semiconductor layers of a first conductivity type opposite to the second conductivity type. The multilayer component forms at least three bipolar transistors in one semiconductor body. Here, semiconductor layers of the second conductivity type form the bases of the transistors, while semiconductor layers of the first conductivity type form an intermediate base layer in addition to at least one collector and at least one emitter. The intermediate base layer borders on the semiconductor layers of the second conductivity type. In this context, the intermediate base layer includes a first semiconductor material and at least one semiconductor layer of the second conductivity type includes a second semiconductor material.

In accordance with the invention, the value of the energy gap in the second semiconductor material can be smaller than the value of the energy gap in the first semiconductor material by at least the mean thermal energy of the charge carriers. The difference in the values of the energy gaps can be preferably at least five times the mean thermal energy of the charge carriers.

A preferred embodiment of the multilayer component of the invention provides for the semiconductor layers of the first and second conductivity types to be arranged essentially parallel to a primary surface of the semiconductor body. In the primary surface, the crystal lattice is in a <100>, <110>, or <111> orientation, for example. The primary surface here offers the possibility to structure the semiconductor, in particular the three transistors, by photolithographic processes, for example. The primary surface is preferably the front side of the wafer in this process.

In an advantageous embodiment of the invention, all semiconductor layers of the first and second conductivity types in the semiconductor body that are contacted are contacted on the front side of the semiconductor body. The front side contacts are accomplished by a metallization, which permits short connections between the contacts of the components with negligible inductance for high-frequency circuits. Considered as the front side, for example, is the side of a wafer that has the contact surfaces for connections for the components. The front side contacts achieve relatively low contact resistances for the multilayer components with relatively thin semiconductor regions, improving especially the transient characteristics that are important for the high frequency range.

Another aspect of the invention is a utilization of the previously described multilayer component as a high-blocking active component in a voltage range where the transient characteristics are primarily determined by the transit time through the space charge zone between the collector and the base of at least one of the transistors bordering on the maximum usable voltage. In order to achieve the largest possible space charge zone, and large contact areas for high-current application, the collector of this transistor is advantageously contacted from the rear side of the wafer.

The multilayer components can in particular be used as high-blocking active components. For example, in a voltage range in which the transient characteristics of a transistor are determined by the transit time through the collector-base space charge zone, a two-stage tetrode can achieve approximately 1.5 to 3 times the Johnson product of a high-blocking transistor. While the blocking capability of a two-stage tetrode is three to ten times as high as that of a transistor with comparable collector doping, the gain-bandwidth product $f_T$ is inversely proportional to the root of the base-collector voltage, so that replacing a high-blocking transistor with a two-stage tetrode allows the Johnson product to be raised by a factor of $\sqrt{3}$ to $\sqrt{10}$. This circumstance can be applied in a corresponding manner to multilayer components having three integrated transistors.

Typical areas of application for high-blocking multilayer components include active elements in switching power supplies and control of piezoelectric actuators in print heads, micro-metering pumps or loudspeakers. In switching power supplies, switching losses in particular can be significantly reduced through the use of inventive multilayer components.

In an integrated circuit, the collector layer thickness of individual transistors can be reduced using inventive multilayer components when controlling piezoelectric actuators in the voltage range of, for example, 200 V. In this way, it is possible to increase the packing density within the integrated circuit and achieve a significant cost reduction.

Another aspect of the invention is a utilization of the previously described multilayer component as a super-high-frequency-capable active component in a frequency range where the transient characteristics are primarily affected by the Miller effect.

In a frequency range where the transient characteristics are primarily affected by the Miller effect, the use of a multilayer component makes it possible to achieve a Johnson product 3 to 10 times larger than for a transistor, as a result of the higher achievable voltage swing $\Delta U_C$ and the avoidance of the Miller effect. Typical applications of high-frequency-capable multilayer components are, for example, in mobile communications and signal processing and the control of optical modulators for data transmission in fiber-optic networks.

In addition, using inventive multilayer components instead of transistors makes it possible to attain a higher power gain per amplifier stage and thereby reduce the number of amplifier stages and the quiescent power consumption. In mobile applications such as cell phones and notebook computers, it is thus possible to significantly increase the charging intervals of the energy sources, in particular rechargeable batteries.

While cost-effective, mature and simple production processes for integrated circuits are available in the lower high-frequency range of a few GHz or below one GHz, applications in the frequency ranges above the X band frequently require a transition to other, less cost-effective semiconductor material systems with more complicated processing, such as GaAs for example. The use of the inventive multilayer components extends the frequency range accessible with a given semiconductor material system, in particular silicon. In this way the production costs for signal-processing devices in high frequency ranges are significantly reduced.

Carrier frequencies of approximately 200 THz permit high modulation rates in data transmission in glass fiber networks. Above a data rate of approximately 10 Gb/s, a signal is impressed on the beam of a continuously operated laser diode by a subsequent optical modulator. Mach-Zehnder interferometers, in particular, which require control voltages of up to about 10 V, are used as optical modulators. In contrast to the situation with prior art semiconductor components, high-frequency control signals in the necessary voltage range can be made available in a simple and cost-effective manner by the inventive multilayer components.

An additional object of the invention is a semiconductor arrangement of at least three bipolar transistors in a semiconductor body. The base of each of the bipolar transistors is formed from a semiconductor region of a second conductivity type. An intermediate base region of a first conductivity type (opposite to the second conductivity type) borders on each semiconductor region of the second conductivity type of the three bipolar transistors. The semiconductor arrangement has at least one heterojunction between the intermediate base region and one of the semiconductor regions of the first charge type.

A first embodiment of this version of the invention provides that the intermediate base region forms a collector of at least one bipolar transistor and emitters of at least two bipolar transistors. This arrangement of the bipolar transistors permits an advantageous circuit arrangement as part of a differential amplifier or mixer. For example, two of these semiconductor arrangements can be wired as a multiplicative mixer stage.

In a second embodiment of this version of the invention, the intermediate base region forms an emitter of at least one bipolar transistor and collectors of at least two bipolar transistors. This embodiment permits integration of super high frequency ECL circuits, for example.

A further embodiment of the invention provides for the intermediate base region to be homogeneously doped. Homogeneous doping of the intermediate base region is understood to mean that the dopant concentrations at any two points in this semiconductor region differ from one another by less than two powers of ten, preferably by less than one power of ten.

For operation of a semiconductor arrangement, preferably as a branched cascode, electrical contact is generally made at least to the collector region, the base regions, and the emitter region. In another embodiment of the invention, the intermediate base region also has an electrical contact. In this way, a possible tendency toward oscillation can be suppressed.

The voltage that appears in an uncontacted intermediate base region depends on the one hand on the collector current, but on the other hand also plays a part in determining the collector current. On account of the final charge and discharge times, the voltage in the intermediate base region responds with delay to changes in the collector current, exactly as the collector current adapts only with a time delay to a voltage change in the intermediate base region. This results in a control loop with a time constant. Some embodiments tend toward oscillation below the time constant. This tendency toward oscillation can be suppressed by setting the voltage in the intermediate base region by an electrical contact.

In an advantageous further development of this semiconductor arrangement in the high frequency range, the dopant concentration can be specified in that the intermediate base region can have a dopant concentration of at least $1 \cdot 10^{17}$ cm$^{-3}$, preferably more than $5 \cdot 10^{17}$ cm$^{-3}$. As a result of the homogeneous doping, the intermediate base region, which forms the collector of the first transistor, can be better adapted for specific high-frequency characteristics of this transistor.

Moreover, the high-frequency characteristics of the semiconductor arrangement of the invention can be improved in that, in a further embodiment of the invention, the intermediate base region can have a thickness of less than 200 nm, preferably less than 100 nm. The high-frequency characteristics can be improved with decreasing thickness. This is in particular possible because a highly doped region is not required in addition to the inventive homogeneously doped intermediate base.

Preferred applications of the semiconductor arrangement are a branched cascode circuit of an ECL gate and a branched cascode circuit of a Gilbert mixer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1b is an equivalent circuit diagram for the semiconductor arrangement from FIG. 1a;

DETAILED DESCRIPTION

Figure 1:
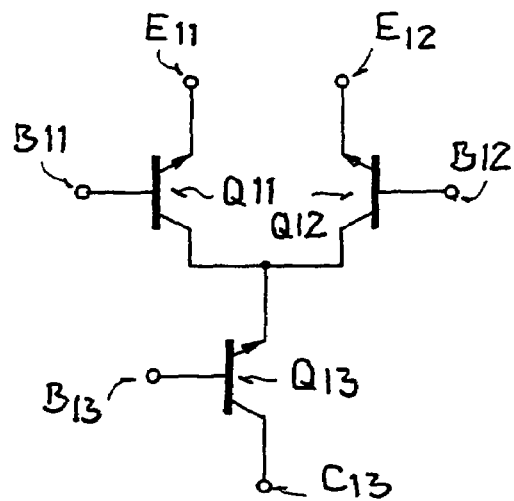
FIG. 1 is a first circuit component of an integrated semiconductor arrangement having three npn transistors.

Active bipolar components include, among others, bipolar transistors in the npn and pnp types, hereinafter referred to as transistors. Electrical parameters for small signal operation, such as the current gain $\beta$ and the Early voltage $V_a$, are important for characterization of active components such as transistors. The current gain $\beta$ here is inversely proportional to the Gummel number $G_B$, the dopant integral over the non-depleted base. An increase in the base-collector voltage reduces the size of the non-depleted base and increases the current gain $\beta$. The relative change in the current gain $\beta$ increases as the current gain $\beta$ increases, so that the product of the Early voltage $V_A$ and the current gain $\beta$ is limited.

Transient characteristics and blocking capability are also important in the use of active bipolar components as amplifying elements or switches. One parameter for characterizing transient characteristics is the gain-bandwidth product $f_T$. The achievable voltage swing $\Delta U_C$ represents a parameter for blocking capability, which is inversely proportional to the level of collector doping.

In the case of high-blocking transistors, the transient characteristics are primarily determined by the collector transit time. Here, the charge carriers traverse a reverse-biased space-charge zone at saturation velocity, so that the collector transit time at maximum collector voltage is inversely proportional to the level of collector doping. In the high-frequency range, the transient characteristics are determined by the base transit time and the base charging time. At a signal transition, the base-emitter capacitance undergoes charge transfer. The higher the current density is, the faster the charge transfer will be. As a result, the gain-bandwidth product $f_T$ initially increases with increasing collector current. Once the density of the mobile charge carriers in the collector drift zone becomes comparable to the charge density of the ion cores, the effective base width increases (Kirk effect). This increases the base transit time, and the gain-bandwidth product $f_T$ drops again at high current densities. Moreover, the current density at the onset of the Kirk effect is proportional, and the base transit time is inversely proportional, to the level of collector doping. Even when neglecting the base transit and charging times, the transit time through the base-collector space-charge zone results in a material-dependent upper limit on the Johnson product, i.e. the product of the gain-bandwidth product $f_T$ and the voltage swing $\Delta U_C$.

In hetero bipolar transistors (HBT), the electrical characteristics, in particular the high-frequency characteristics, are improved by means of heterojunctions. A junction between a first semiconductor region of a first semiconductor material and a second semiconductor region of a second semiconductor material is referred to as a heterojunction. In this context, the junction can be either abrupt, i.e. take place as a sudden change between the first and second semiconductor materials, or can be stepped or continuous in that the composition in a junction region (mixed region) of the semiconductor material varies in a stepped or continuous manner.

A heterojunction of a hetero bipolar transistor between base and collector makes it possible for the collector current of a transistor to be proportional to the intrinsic charge carrier concentration in the base, while the intrinsic charge carrier concentration in the semiconductor rises exponentially with a decreasing value of the band gap. Accordingly, a reduction in the band gap in the base of a transistor increases the collector current and with it the current gain $\beta$. At the same time, the blocking capability of a transistor depends in part upon the breakdown field strength in the collector drift zone, which is approximately proportional to the square root of the third power of the value of the band gap in the collector. Accordingly, a smaller value of the band gap in the base than in the collector makes it possible to combine high blocking capability with a high current density and a high gain-bandwith product $f_T$ above several GHz. A smaller band gap value in the base than in the collector can be achieved, in particular, with the aid of a heterojunction between the base and the collector.

In a hetero bipolar transistor (HBT) with a heterojunction between base and emitter, the edge of the band that carries the majority charge carriers in the emitter is at comparable energies in the base and emitter during active forward operation. For different values of the band gap in the base and the emitter, the edge of the band that carries the majority charge carriers in the base is at different energies in the base and the emitter. In particular, if the value of the energy gap in the base is selected to be smaller than in the emitter, then in active forward operation of the transistor the movement of base majority charge carriers into the emitter is suppressed by means of an energy barrier, the base current is reduced, and the current gain $\beta$ is increased. A smaller value of the band gap in the base than in the emitter can be achieved, in particular, with the aid of a heterojunction between the base and the emitter.

The base transit time can be reduced by a quasi-electric field in that a spatial variation in the band gap in a non-depleted semiconductor region with a location-independent electrochemical potential and a location-independent edge of the majority charge carrier band results in a band edge gradient in the minority charge carrier band. As a result, even in the non-depleted semiconductor region, the minority charge carriers experience an accelerating field that is referred to as quasi-electric, so that the base transit time is reduced and the gain-bandwidth product $f_T$ is increased.

Furthermore, the electrical characteristics of active semiconductor components can be improved in that an individual transistor in a common-emitter circuit with a resistive load on the collector is replaced by a cascode circuit—constructed of discrete components or laterally integrated—consisting of a driven transistor in a common-emitter circuit and one or two auxiliary transistors in a common-base circuit. The auxiliary transistor here supplies the resistive load. On account of the low input resistance of the auxiliary transistor, the driven transistor experiences only a small voltage swing $\Delta U_C$, so that the cascode circuit has a higher Early voltage $V_a$ for the same current gain $\beta$ as the driven transistor, and the driven transistor can be implemented as low-blocking and fast. For current amplification, a transistor is generally operated in a common-emitter circuit. In contrast, the blocking capability in the common-base circuit is typically three to ten times as high. Accordingly, a cascode connection of a transistor as an auxiliary transistor with a low-blocking driven transistor increases the achievable voltage swing $\Delta U_C$ and the Johnson product. Moreover, the switch to the cascode circuit or a branched cascode circuit reduces the Miller effect and increases the gain-bandwidth product $f_T$. Frequencies in the range of several GHz can be achieved in this way.

Another important factor in the use of active components is the achievable power gain. While the driven transistor of a cascode circuit is used for current gain, the auxiliary transistor serves as an impedance converter for voltage gain. The power gain achieved with the cascode circuit or the branched cascode circuit described below is calculated as the product of the power gain of the driven transistor and that of the relevant auxiliary transistor.

Figure 2:
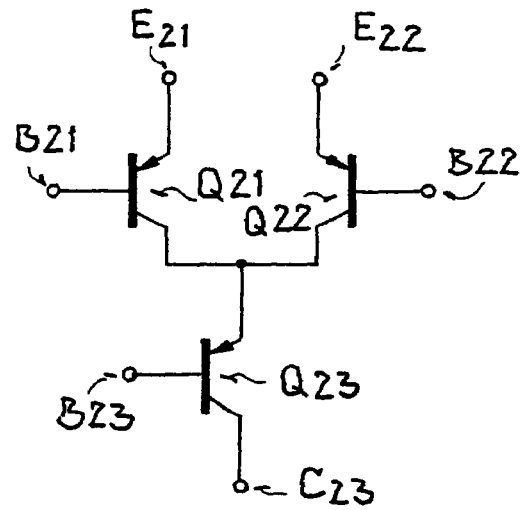
FIG. 2 is a second circuit component of an integrated semiconductor arrangement having three pnp transistors.

FIG. 1 shows a portion of a circuit with three npn bipolar transistors Q11, Q12 and Q13, which are integrated together in a semiconductor body. The circuit component is used as a branched cascode circuit, for example as a component of an ECL logic element. Here, the emitter of a first transistor Q13 is connected to the collectors of the second and third transistors Q11 and Q12. Integrated into the semiconductor body, this emitter and these two collectors form a common n-doped semiconductor region. An arrangement of pnp transistors that is complementary to the arrangement in FIG. 1 is shown in FIG. 2. In this case as well, the emitter of the transistor Q23, together with the collectors of the transistors Q21 and Q22, forms a common n-doped semiconductor region.

Figure 3:
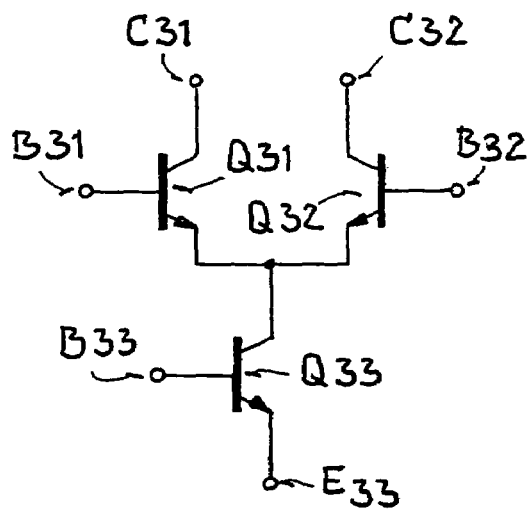
FIG. 3 is a third circuit component of an integrated semiconductor arrangement with three npn transistors.
Figure 4:
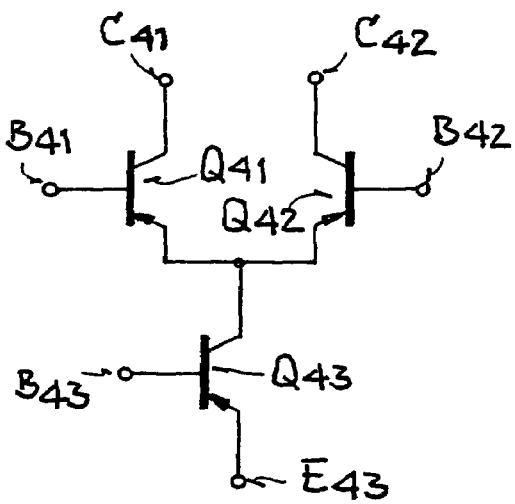
FIG. 4 is a fourth circuit component of an integrated semiconductor arrangement with three pnp transistors.

FIG. 3 shows another arrangement of integrated npn transistors. In this example embodiment, the two emitters of the transistors Q31 and Q32 are connected with the one collector of the transistor Q33. A circuit component of this nature constitutes part of a differential amplifier or a mixer, for example. For instance, two of these circuit components can be wired together as a multiplicative mixer stage. In this example embodiment, the two emitters of the transistors Q31 and Q32 together with the one collector of the transistor Q33 form an n-doped semiconductor region. Once again, an arrangement of pnp transistors that is complementary to the arrangement in FIG. 3 is shown in FIG. 4.

Figure 1A:
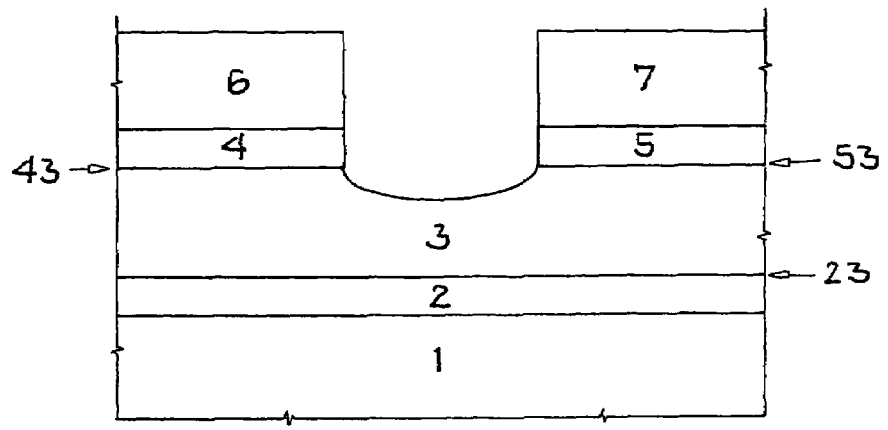
FIG. 1a is a semiconductor arrangement with vertically arranged semiconductor layers which form the transistors from FIG. 1.

FIG. 1a shows a schematic cross-section through a semiconductor body with multiple semiconductor layers 1, 2, 3, 4, 5, 6, and 7. This semiconductor arrangement has first an n-doped collector region 1, a p-doped base region 2 of a first semiconductor material located on the collector region 1, and an n-doped intermediate base region 3 of a second semiconductor material located on the base region 2. FIG. 1a also shows two separate p-doped base regions 4 and 5 located on the intermediate base region 3; located on each base region in turn is an n-doped emitter region 6 or 7, respectively. A heterojunction 23 is formed between the base region 2 and the intermediate base region 3. In the semiconductor material of the base region 2, the valence band edge is at a significantly higher energy than in the semiconductor material of the intermediate base region 3, while the conduction band edges in the two semiconductor materials have comparable energies.

The semiconductor arrangement contains a first, a second, and a third npn transistor. The first npn transistor includes the first emitter region 6 as emitter, the first base region 4 as base, and the intermediate base region 3 as collector. The second npn transistor comprises the second emitter region 7 as emitter, the second base region 5 as base, and the intermediate base region 3 as collector. The third npn transistor is composed of the intermediate base region 3 as emitter, the third base region 2 as base, and the collector region 1 as collector. In addition, the semiconductor arrangement contains a parasitic pnp transistor with two collectors, composed of the third base region 2 as emitter, the intermediate base region 3 as base, and the first base region 4 and second base region 5 as collectors. Moreover, an additional parasitic pnp transistor can be formed by the first base region 4 and the second base region 5 as emitter, or respectively as collector, and the intermediate base region 3 as base. The arrangement of the semiconductor layers 1, 2, 3, 4, 5, 6, and 7 from FIG. 1a thus corresponds to the circuit from FIG. 1.

The pn junction between the third base region 2 and the intermediate base region 3 serves as the emitter diode of the third npn transistor and of the parasitic pnp transistor simultaneously. Electrons flowing from the intermediate base region 3 into the third base region 2 carry the emitter current of the third npn transistor. In contrast, the holes moving from the third base region 2 into the intermediate base region 3, carry the emitter current of the parasitic pnp transistor. While the flow of electrons from the intermediate base region 3 to the third base region 2 is not hindered by the heterojunction 23, the number of holes moving from the third base region 2 into the intermediate base region 3 in active forward operation of the third transistor is reduced because of the different energy levels of the valence band edges in the first and second semiconductor materials.

Figure 1B:
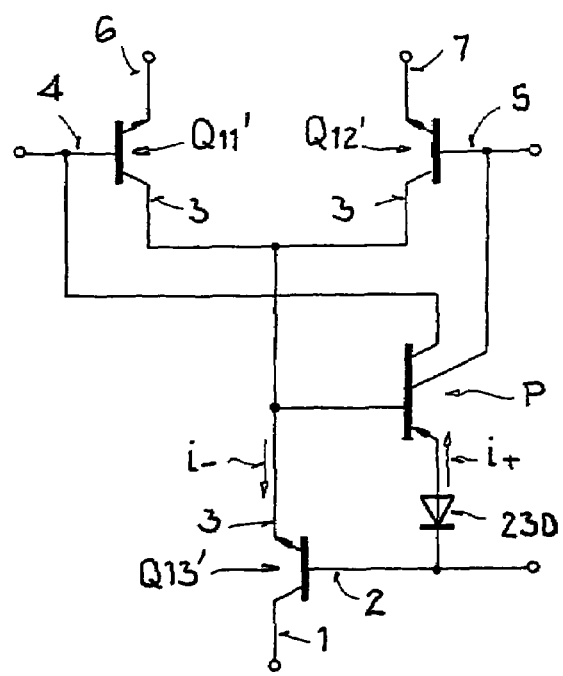

The equivalent circuit diagram of FIG. 1b is derived from these physical effects. The first npn transistor of the semiconductor arrangement from FIG. 1a is rendered by an npn transistor symbol Q11'. The second npn transistor is rendered by an npn transistor symbol Q12', and the third npn transistor by an npn transistor symbol Q13'. The parasitic pnp transistor P with two collector connections, which is dominant on account of the external circuitry, is also shown. The collectors of the npn transistors Q11' and Q12', the base of the parasitic pnp transistor P, and the emitter of the npn transistor Q13' are connected to one another. A first collector of the pnp transistor P is shorted to the base of the npn transistor Q11', a second collector of the parasitic pnp transistor P is shorted to the base of the npn transistor Q12'.

In the equivalent circuit diagram, the current through the pn junction from the third base region 2 and the intermediate base region 3 is split into an electron current $i_-$ and a hole current $i_+$. The electron current $i_-$ represents the emitter current of the npn transistor Q13', while the hole current $i_+$ represents the emitter current of the parasitic pnp transistor P.

The heterojunction 23 influences the hole current $i_+$ far more strongly than the electron current $i_-$. The effect of the heterojunction 23 can be rendered in the equivalent circuit diagram by a diode 230 in the current path of hole current $i_+$: the emitter of the parasitic pnp transistor P is connected to the base of the npn transistor Q13' through the diode 230. In this regard, the diode 230 is polarized such that it significantly reduces, and advantageously entirely suppresses, the flow of holes into the emitter of the parasitic pnp transistor P. On account of the diode 230, the parasitic pnp transistor P remains essentially inactive in the equivalent circuit diagram, so that the effects of the parasitic pnp transistor P can be ignored to a first approximation. Accordingly, the actual electrical behavior of the semiconductor arrangement can be described by a simplified equivalent circuit diagram with the circuit topology of the example circuit in FIG. 1.

In another further development of this embodiment of the invention, the second semiconductor region 2 is made of a different semiconductor material than the first semiconductor region 1. In this way, the breakdown voltage, in particular, of the diode between the first semiconductor region 1 and the second semiconductor region 2 can be increased without adversely affecting the transient characteristics of the transistors. By means of a stepped or continuous design of a heterojunction between the first semiconductor region 1 and the second semiconductor region 2, in particular piezoelectric effects and stresses on the crystal lattice at lattice defect adjustments can be reduced, ensuring an unhindered flow of charge carriers.

In another further development of this embodiment of the invention, the fourth semiconductor region 4 or the fifth semiconductor region 5 is produced from a different semiconductor material than the third semiconductor region 3. Due to a stepped or continuous design of the heterojunction 43 between the third semiconductor region 3 and the fourth semiconductor region 4, and also of the heterojunction 53 between the third semiconductor region 3 and the fifth semiconductor region 5, piezoelectric effects and stresses on the crystal lattice at lattice defect adjustments can be reduced. Moreover, an unhindered flow of charge carriers can be ensured, even in those cases in which the movement of charge carriers of the first charge type from the first and second base regions 4, 5 into the intermediate base region 3 is hindered by a band edge discontinuity as a result of an abrupt heterojunction 43, 53.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A multilayer component comprising:
   first semiconductor layers of a second conductivity type; and
   second semiconductor layers of a first conductivity type, which form at least three transistors,
   wherein the first semiconductor layers of the second conductivity type form the bases of the transistors,
   wherein the second semiconductor layers of the first conductivity type form an intermediate base layer in addition to at least one collector and at least one emitter,
   wherein the intermediate base layer borders on the first semiconductor layers of the second conductivity type, the intermediate base layer having a first semiconductor material,
   wherein at least one semiconductor layer of the second conductivity type has a second semiconductor material, and
   wherein a value of an energy gap in the second semiconductor material is smaller less than a value of an energy gap in the first semiconductor material by at least an amount that is equal to a value of a mean thermal energy of charge carriers.

2. The multilayer component according to claim 1, wherein the semiconductor layers of the first and second conductivity types are arranged parallel to a primary surface of the semiconductor body.

3. The multilayer component according to claim 1, wherein all semiconductor layers of the first and second conductivity types in the semiconductor body that are contacted, are contacted on a front side of the semiconductor body.

4. The multilayer component according to claim 1, wherein the amount is equal to at least fives times the value of the mean thermal energy of the charge carriers.

5. The multilayer component according to claim 1, wherein the at least three transistors are bipolar transistors.

6. A multilayer component comprising:
   first semiconductor layers of a second conductivity type; and
   second semiconductor layers of a first conductivity type, which form at least three transistors,
   wherein the first semiconductor layers of the second conductivity type form the bases of the transistors,
   wherein the second semiconductor layers of the first conductivity type form an intermediate base layer in addition to at least one collector and at least one emitter,
   wherein the intermediate base layer borders on the first semiconductor layers of the second conductivity type, the intermediate base layer having a first semiconductor material,
   wherein at least one semiconductor layer of the second conductivity type has a second semiconductor material,
   wherein a difference between a value of an energy gap in the second semiconductor material and a value of an energy gap in the first semiconductor material is equal to at least a value of a mean thermal energy of charge carriers.

* * * * *